United States Patent
Anwar et al.

(10) Patent No.: US 7,292,045 B2
(45) Date of Patent: Nov. 6, 2007

(54) DETECTION AND SUPPRESSION OF ELECTRICAL ARCING

(75) Inventors: Suhail Anwar, San Jose, CA (US); Remegio Manacio, San Jose, CA (US); Chung-Hee Park, Seoul (KR); Dong-Kil Yim, Sungnam (KR); Soo Young Choi, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/149,896

(22) Filed: Jun. 10, 2005

(65) Prior Publication Data

US 2006/0049831 A1 Mar. 9, 2006

Related U.S. Application Data

(60) Provisional application No. 60/607,149, filed on Sep. 4, 2004.

(51) Int. Cl.
*G01R 31/08* (2006.01)
*G01N 27/66* (2006.01)
(52) U.S. Cl. .................................. 324/536; 324/464
(58) Field of Classification Search ................ 324/536, 324/409, 464
See application file for complete search history.

(56) References Cited

U.S. PATENT DOCUMENTS

| | | | | |
|---|---|---|---|---|
| 3,020,529 A | * | 2/1962 | Turner | 340/657 |
| 3,519,927 A | * | 7/1970 | Holt | 324/409 |
| 4,588,952 A | * | 5/1986 | Matsuoka | 324/409 |
| 5,643,364 A | * | 7/1997 | Zhao et al. | 118/723 E |
| 6,124,758 A | * | 9/2000 | Korte et al. | 330/124 R |
| 6,718,272 B1 | * | 4/2004 | Fisk et al. | 702/58 |
| 6,954,077 B2 | * | 10/2005 | Strang | 324/636 |
| 2003/0063420 A1 | * | 4/2003 | Pahl et al. | 361/93.1 |
| 2006/0259259 A1 | * | 11/2006 | Rozenboim et al. | 702/83 |

* cited by examiner

*Primary Examiner*—Anjan Deb
(74) *Attorney, Agent, or Firm*—Robert J. Stern

(57) ABSTRACT

Method and apparatus for detecting or suppressing electrical arcing or other abnormal change in the electrical impedance of a load connected to a power source. Preferably the load is a plasma chamber used for manufacturing electronic components such as semiconductors and flat panel displays. Arcing is detected by monitoring one or more sensors. Each sensor either responds to a characteristic of the electrical power being supplied by an electrical power source to the plasma or is coupled to the plasma chamber so as to respond to an electromagnetic condition within the chamber. Arcing is suppressed by reducing the power output for a brief period. Then the power source increases its power output, preferably to its original value. If the arcing resumes, the power source repeats the steps of reducing and then restoring the power output.

24 Claims, 10 Drawing Sheets

DETECTION AND SUPPRESSION OF ELECTRICAL ARCING

This application claims the benefit of U.S. Provisional Application No. 60/607,149 filed Sep. 4, 2004.

FIELD OF THE INVENTION

The invention relates generally to apparatus and methods for detecting or suppressing electrical arcing or any other abnormal change in the electrical impedance of a load to which a power source is supplying electrical power. Preferably the load is a plasma chamber used for manufacturing electronic components such as semiconductors and flat panel displays, and the abnormal change that the invention detects or suppresses comprises electrical arcing within the plasma chamber.

BACKGROUND OF THE INVENTION

Plasma chambers commonly are used for performing various processes such as chemical vapor deposition, sputter deposition and plasma-enhanced etching processes used in manufacturing an electronic workpiece such as a semiconductor device or flat panel display. Commonly the plasma within a plasma chamber is sustained by coupling RF or DC power from an electrical power source to the plasma. The coupling is accomplished typically by connecting the power source to an electrode within the chamber or to an antenna or magnetic coil within or adjacent to the chamber.

The conditions within a plasma chamber generally change during the progression of the manufacturing process being performed within the chamber, and such changes sometimes cause electrical arcing within the chamber. If any electrical arcing occurs between the plasma and the workpiece being manufactured, or between the plasma any of the chamber components, damage may occur to the workpiece or the chamber components. The risk of damage increases with the duration of the arcing.

To minimize or prevent such damage, there is a need for apparatus that can quickly detect electrical arcing within the plasma chamber or any other abnormality that changes the electrical load impedance that the chamber presents to the power source. In addition, a need exists for apparatus that can suppress (i.e., stop) the arcing while allowing the plasma process to continue with as little interruption as possible.

More generally, there is a need for apparatus that can quickly detect or suppress abnormal changes in an electrical load to which a power source is supplying electrical power.

SUMMARY OF THE INVENTION

One aspect of the invention is an apparatus and method of detecting electrical arcing in a plasma chamber by monitoring one or more sensors. Each sensor either responds to a characteristic of the electrical power being supplied by an electrical power source to the plasma or is coupled to the plasma chamber so as to respond to an electromagnetic condition within the chamber. The electromagnetic condition detected by a sensor coupled to the plasma chamber can be, for example, an electric field, a magnetic field, or optical radiation within the chamber.

The monitoring preferably comprises detecting when an electrical signal produced by a sensor, or a value derived from (i.e., as a function of) one or more such sensor signals, crosses a threshold. An example of a value derived from a sensor signal is the rate of change of the sensor signal.

When the power source is an RF power source, a sensor responsive to the RF power supplied to the plasma chamber preferably comprises an RF directional coupler connected between the RF power source and the plasma chamber that detects one or more of forward RF power, reflected RF power, and reflected power coefficient. The monitoring preferably comprises detecting the occurrence of arcing when the reflected RF power or the reflected power coefficient exceeds a first threshold or the rate of change of the reflected power or reflected power coefficient exceeds a second threshold.

A second aspect of the invention is adapted to manufacturing systems in which a manufacturing process controller controls the output power produced by the electrical power source so that it produces different levels of power at different steps or stages of a manufacturing process. In this aspect of the invention, the aforesaid one or more thresholds are adjusted dynamically in response to the power level currently selected by the process controller. An advantage of this invention is that it enables arcing to be detected with high sensitivity because the thresholds can be closely tailored to the power output of the power source.

A third aspect of the invention is an apparatus and method of suppressing arcing without stopping the plasma process that is being performed in the plasma chamber. When arcing is detected, the power source briefly reduces its output power, preferably to zero power. Normally this will eliminate the arcing. After a very brief period of time, typically a few milliseconds or less, the power source increases its power output, preferably to its original value. If the arcing resumes, the power source reduces its power again for a brief period. Typically the arcing will completely disappear after a few repetitions of these brief periods of reduced power, so that the plasma process being performed in the chamber typically can resume after an interruption of only ten milliseconds or so.

A fourth aspect of the invention is an apparatus and method of detecting an abnormal change in the electrical impedance of an electrical load to which an electrical power source is connected. The fourth aspect is a generalization of the first aspect to include abnormalities in impedance other than arcing and to include an electrical load that need not be a plasma chamber. An abnormal change in the electrical impedance of the load is detected by monitoring one or more sensors that respond to a characteristic of the power being supplied by the power source to the load. The monitoring preferably comprises detecting when an electrical signal produced by a sensor, or a value derived from one or more sensor signals, crosses a threshold. An example of a value derived from a sensor signal is the rate of change of the sensor signal.

When the power source is an RF power source, a sensor preferably comprises an RF directional coupler connected between the RF power source and the load that detects one or more of forward RF power, reflected RF power, and reflected power coefficient. The monitoring preferably comprises detecting an abnormal change when the reflected RF power or the reflected power coefficient exceeds a first threshold or the rate of change of the reflected power or reflected power coefficient exceeds a second threshold.

A fifth aspect of the invention is an apparatus and method of reversing (i.e., returning to normal) an abnormal change in the electrical impedance of an electrical load to which an electrical power source is connected. The fourth aspect is a generalization of the third aspect to include abnormalities in impedance other than arcing and to include an electrical load that need not be a plasma chamber.

When an abnormal change in the electrical impedance of the load is detected, the power source briefly reduces its output power, preferably to zero power. This may eliminate the abnormality. After a very brief period of time, typically a few milliseconds or less, the power source increases its power output, preferably to its original value. If the abnormality is detected again, the power source reduces its power again for a brief period. The abnormality may completely disappear after a few repetitions of these brief periods of reduced power, so that the normal operation of the power source can resume.

DETAILED DESCRIPTION OF THE PREFERRED EMBODIMENTS

1. Hardware

Figure 1:
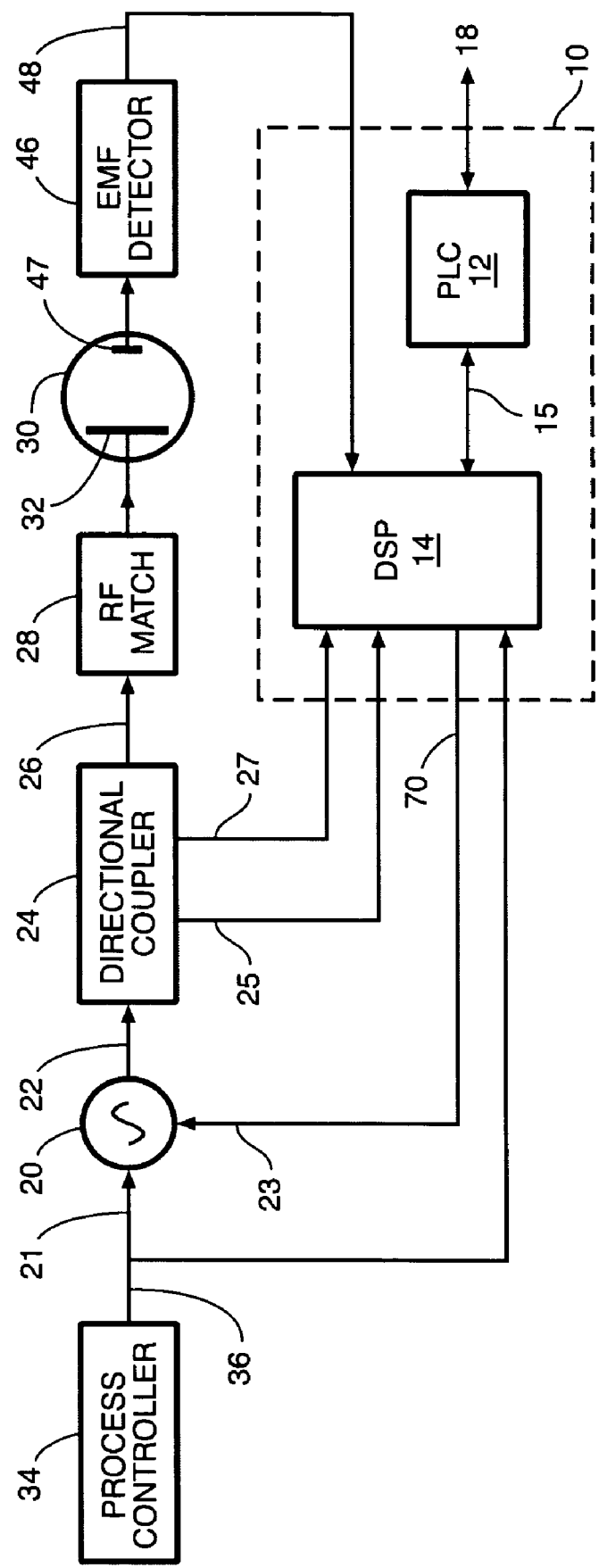
FIG. 1 is a schematic block diagram of the arc detection and suppression circuit in combination with an RF power source and plasma chamber.

FIG. 1 shows an apparatus that can both detect arcing and suppress arcing according to different aspects of the present invention. The apparatus includes an electrical circuit 10 referred to herein as the "arc detection and suppression circuit" or "ADSC". The ADSC 10 implements our novel arc detection and suppression algorithms as described below. The ADSC can be a digital circuit such as a programmable computer, an analog electrical circuit, or a combination of digital and analog circuits, examples of which are described below.

As stated in the above Summary of the Invention, our arc detection and suppression circuit also is useful more generally to detect or suppress abnormalities in impedance other than arcing. In this more general case, the ADSC 10 can be referred to as the "impedance abnormality detection and suppression circuit". Suppression of an impedance abnormality means reversing the abnormal condition so as to return the impedance to its normal value or normal range of values. Although the following description of the preferred embodiments repeatedly refers to arcing, the term "arcing" can be replaced by "impedance abnormality" throughout the description.

Similarly, as stated in the Summary of the Invention, the invention also is useful for an electrical load that need not be a plasma chamber. An abnormal change in the electrical impedance of the load is detected by monitoring one or more sensors that respond to a characteristic of the power being supplied by the electrical power source to the load. Although the following description of the preferred embodiments repeatedly refers to a plasma chamber, the plasma chamber can be replaced by any electrical load.

The illustrative manufacturing system to which the ADSC 10 is connected includes an RF power source 20 having an RF output 22 connected to the input of an RF directional coupler 24. (Commercial RF power generators often combine an RF power source and directional coupler within a single enclosure.) The directional coupler has an RF output 26 connected to the input of an RF impedance matching network 28. The directional coupler senses or measures the forward and reflected RF power propagating from the RF power source 20 to the matching network 28 and produces forward and reflected sensor output signals 25, 27 whose values respectively represent the forward and reflected RF power measurements $S_1$ and $S_2$. The output of the RF matching network is connected to an electrode 32 within a plasma chamber 30. The components described in this paragraph are included in conventional manufacturing systems with RF-powered plasma chambers.

The invention also is applicable to electrical power sources that supply power other than RF power, such as a DC power source connected to supply power to a plasma sputtering chamber. When the electrical power source is a DC power source, there will be no reflected power, but all other sensor signals described below, including forward electrical power, can be used to detect and suppress electrical arcing or other abnormal impedance changes in the electrical load to which the power source is connected to supply power. Accordingly, all references to an RF power source, its enable input, and its power set point input apply equally to a DC power source.

Each manufacturing process performed within the plasma chamber 30 conventionally is controlled by a process controller 34, which is a computer that stores and executes a process sequence program so as to direct and control the actions and parameters of the manufacturing process. For example, the process controller 34 conventionally is programmed to control robots that move workpieces in and out of the plasma chamber, to control gas valves that regulate the flow of various reagent gases into the chamber, and to control an exhaust valve that regulates the gas pressure within the process chamber. The process controller conventionally is supplied as a component of either the process chamber 30 or a multi-chamber platform or mainframe to which the process chamber is connected.

Many manufacturing processes include a sequence of process steps that are performed at different RF power levels. Accordingly, an additional conventional function of the process controller 34 is to control the RF power output level of the RF power source 20 so that the latter supplies different levels of RF power to the plasma chamber 30 at different steps or stages of the process. Specifically, the process controller 34 sends to the RF power control input 21 of the RF power source 20 an RF power set point signal 36

(FIG. 2A) which is a digital or analog electrical signal whose value at any point in time represents the level of RF power currently specified by the process sequence being executed by the process controller.

The RF power source 20 responds to the RF power set point signal 36 by attempting to adjust the actual power level of the RF signal produced at its RF output 22 so that the actual RF power level equals the desired RF power level represented by the value of the RF power set point signal 36. As explained below, an abnormal condition in the process chamber, such as an electrical arc, sometimes can prevent the RF power source 20 from producing the RF power level designated by the RF power set point signal 36.

In preferred embodiments of the present invention, the RF power set point signal 36 is additionally connected to the ADSC 10 so that the ADSC can detect when transitions in RF power level are specified by the process sequence currently being executed by the process controller.

The steps of the arc detection and arc suppression algorithms described in the remainder of this patent specification are performed by the ADSC 10. The ADSC can consist of a single conventional computer processor that is programmed to perform all the functions described below. While such approach is expected to be economically feasible in the near future, presently a single processor fast enough to perform all such functions would be undesirably expensive. Accordingly, our preferred embodiment of the ADSC includes two computer processors: a relatively slow processor which we refer to as the programmable logic controller (PLC) 12, and a much faster processor which we refer to as the digital signal processor (DSP) 14. The ADSC also may include analog electrical circuits such as analog-to-digital converters and analog slope detectors or differentiators as described below.

Both the PLC and the DSP include a programmable arithmetic computation unit and a memory for storing input data, output data, and parameters used by the algorithms described below. The DSP samples a number of sensor signals, optionally derives other values from the sensor signals, and compares them with thresholds (defined below) in real time. Preferably, the DSP is fast enough to perform all these steps in less than one microsecond. The PLC can be slower because it performs interface and logging functions that are less time critical.

The preferred division of functions between the PLC 12 and DSP 14 is included in the following descriptions of the arc detection and arc suppression algorithms. However, any function described below as performed by the DSP or the PLC can be performed instead by any analog or digital circuit or computer processor within the ADSC, such as a single computer processor that performs all the functions of the ADSC.

2. Detection of Arcing

The arc detection and suppression computer (ADSC) 10 is programmed to perform both the arcing suppression algorithm described below under the heading "Arcing Suppression" and the arcing detection algorithm described in the following paragraphs.

The DSP detects the occurrence of an electrical arc within the plasma chamber 30 by monitoring in real time sensor output signals $S_i$ ($S_1$, $S_2$, $S_3$, etc.) produced by one or more sensors and detecting when any of the sensor output signals $S_i$ has an abnormal value suggestive of arcing within the plasma chamber.

One broad category of sensor whose output can be used to detect arcing within the plasma chamber 30 is a sensor that is coupled to the plasma chamber so as to sense an electromagnetic condition within the chamber, such as an electric field, a magnetic field, or optical radiation within the chamber. An example of such a sensor is an optical sensor (not shown) that monitors light radiated by the plasma. Another example is an EMF probe or antenna 47 mounted within the plasma chamber. The antenna is connected to the input of an electromagnetic field (EMF) detector 46, which produces a sensor output signal 48 whose value represents the measurement of the electromagnetic field strength received by the antenna. The output 48 of the EMF detector is connected to the DSP 14.

Another broad category of sensor whose output can be used to detect arcing within the plasma chamber 30 is a sensor that is coupled between an RF power source 20 and the plasma chamber so as to sense (i.e., detect) a characteristic of the RF power being supplied by the RF power source to the plasma.

One example of such a sensor is a conventional directional coupler 24 connected between the RF power source 20 and the RF impedance matching network 28, shown in FIG. 1. The illustrated directional coupler produces two sensor output signals 25, 27 whose respective amplitudes respectively represent the forward RF power and reflected RF power sensed by the directional coupler. Other directional couplers may produce sensor outputs that represent either the ratio between the reflected and forward RF power or else the square root of this ratio, known as the reflected power coefficient. As stated above, commercial RF power generators often combine an RF power source and directional coupler within a single enclosure. If the forward and reflected power outputs 25, 27 of the directional coupler are RF rather than DC signals, a conventional envelope detector (i.e., a rectifier followed by a low pass filter) should be connected between each output of the directional coupler and the ADSC.

A second example of a sensor that senses a characteristic of the RF power is an RF distortion analyzer, such as a harmonic sensor, that detects distortion of the RF voltage or current supplied by the RF power source to the chamber by measuring the amplitude of any spectral components of said voltage or current at frequencies substantially higher than the fundamental frequency of the RF voltage or current.

A third example of such a sensor is an electrically tunable RF matching network 28 having inductors or capacitors whose values are adjusted in response to electrical control signals in order to tune the matching network. These electrical control signals are useful as sensor output signals because changes in the control signals signify changes in the electrical impedance presented by the plasma chamber to the output of the RF matching network. Similarly, other types of RF matching networks 28 are tunable by adjusting the frequency of the RF source 20. With such frequency-tunable matching networks, the frequency of the RF source or the output of a controller that controls such frequency can constitute a sensor output signal $S_i$.

Figure 2:
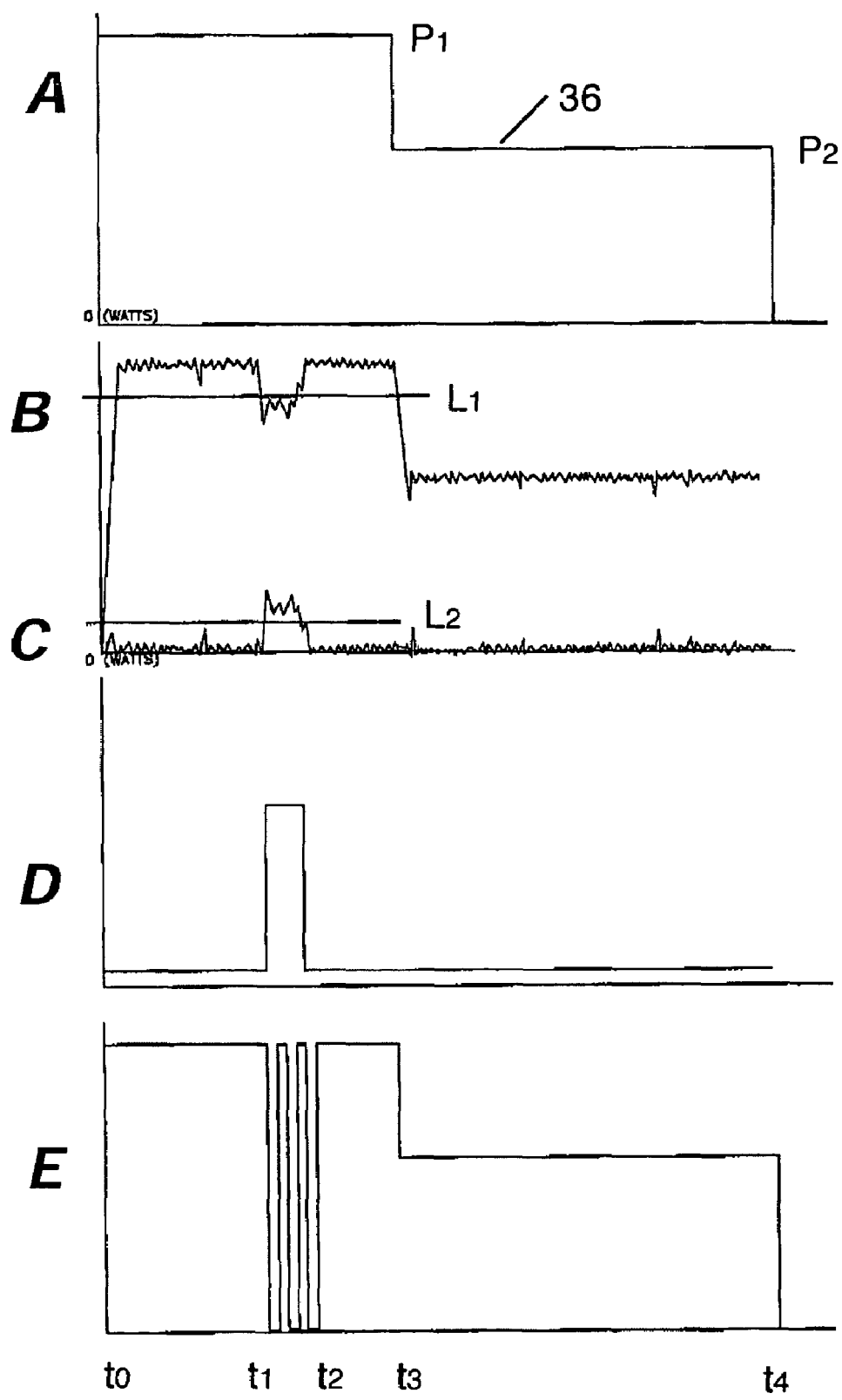
FIG. 2 is a graph that simulates electrical signals during arcing within the plasma chamber.

FIG. 2 graphically illustrates how the forward RF power signal 25 and reflected RF power signal 27 produced by a directional coupler 24 can be used to detect the occurrence of arcing within the plasma chamber 30. FIG. 2A shows the RF power set point signal 36 that the process controller 34 sends to the RF power source 20. Its value represents what the amplitude of the RF power output 22 should be if both the RF power source and the load impedance presented by the plasma chamber 30 were free of fluctuations and instabilities. FIG. 2 illustrates a manufacturing process being performed in the plasma chamber that requires a first level of RF power $P_1$ between times $t_0$ and $t_3$ and a lower level of RF power $P_2$ between times $t_3$ and $t_4$.

FIGS. 2B and 2C respectively show the forward RF power signal 25 and reflected RF power signal 27 detected by the directional coupler 24, which in this example are the first and second sensor signals $S_1$ and $S_2$. Arcing within the plasma chamber begins at time $t_1$ and ends at time $t_2$. During the interval $t_1$-$t_2$ in which arcing occurs, the forward RF power drops and the reflected RF power increases. In our invention, we detect this change in forward and reflected RF power to identify arcing within the plasma chamber.

An optical sensor or EMF sensor coupled to the interior of the plasma chamber, such as RF antenna 47, would behave similarly to reflected power signal 27 graphed in FIG. 2C. Specifically, any of these sensors would have a relatively low steady state value with some noise or instability superimposed thereon, and would have a substantial increase in value when arcing occurs within the plasma chamber.

We have found the reflected RF power signal 27 the single most reliable indicator of arcing because its value is relatively stable in the absence of arcing. The forward RF power signal 25, the EMF sensor signal 48, and the slope (time derivative) of the reflected RF power signal also are useful signals to supplement the reflected RF power signal, but they are characterized by more instability or noise.

In the present invention, each sensor signal $S_i$ is considered to indicate that arcing is occurring according to whether its output signal is below or above a threshold $L_i$, referred to herein as an arcing detection threshold. Some sensor signals, such as the forward RF power 25 ($S_1$), indicate the occurrence of arcing when their value drops below a threshold, while other sensor signals, such as the reflected RF power 27 ($S_2$) and EMF detector 46-48 ($S_3$), indicate the occurrence of arcing when their value exceeds a threshold. To adopt a consistent nomenclature that covers both types of sensor signals, we will refer to the result $R_i$ of a comparison between a sensor output signal $S_i$ and its corresponding arcing detection threshold $L_i$ as being positive or negative according to whether the comparison does or does not indicate the occurrence of arcing, and we will refer to a sensor output signal has having a bad value or a good value according to whether the result $R_i$ of comparing the sensor output signal $S_i$ to its corresponding threshold $L_i$ is positive or negative. Accordingly, the forward RF power sensor signal 25 ($S_1$) is considered bad if it drops below a first threshold $L_1$, whereas the reflected RF power sensor signal 27 ($S_2$) and the EMF detector signal 48 ($S_3$) are considered bad if they exceed a second threshold $L_2$ and a third threshold $L_3$, respectively.

Figure 3:
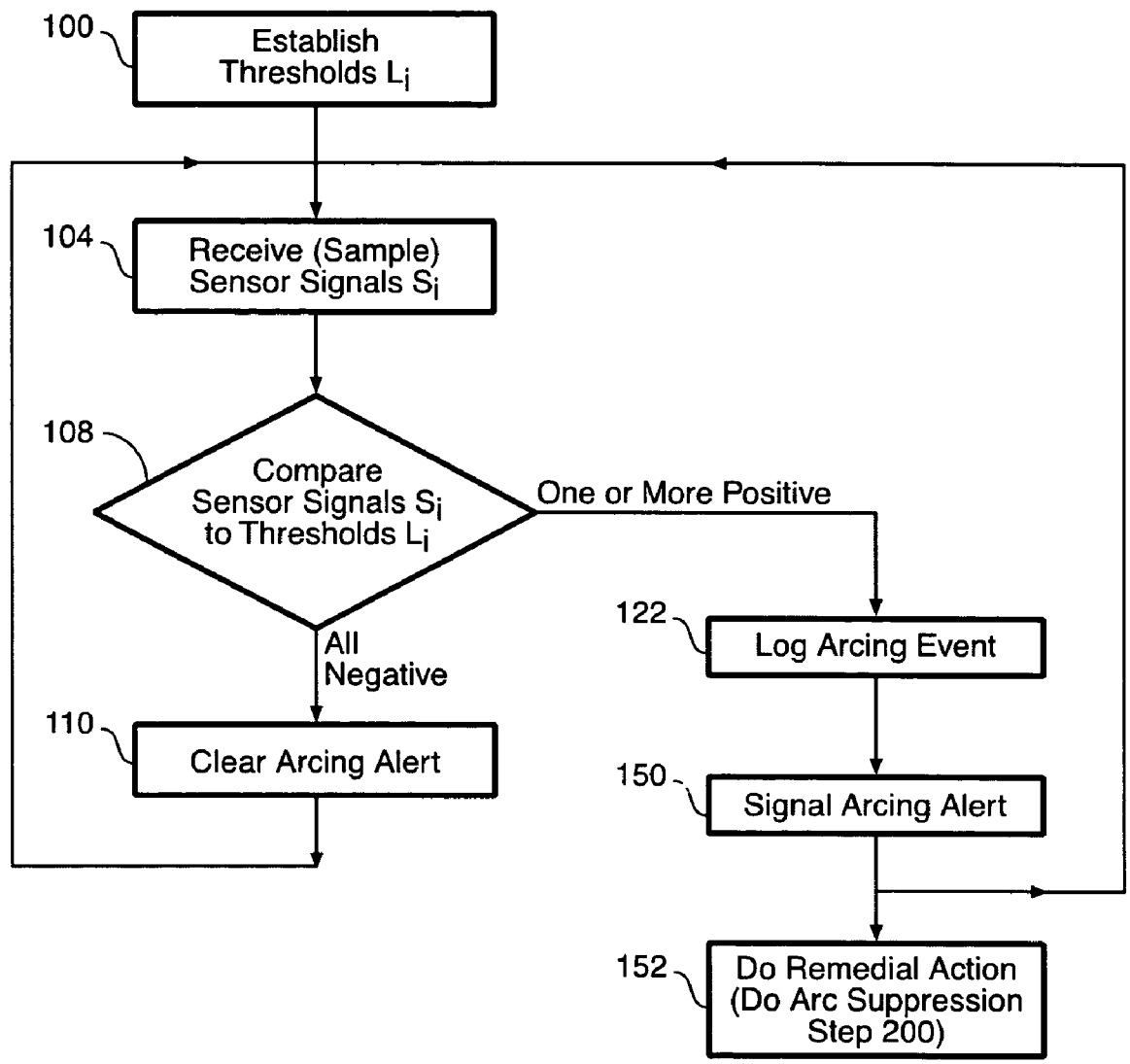
FIG. 3 is a flow chart of the basic arc detection algorithm.

FIG. 3 shows the algorithm performed by the ADSC 10 of FIG. 1. First, the ADSC (either the PLC 12 or the DSP 14, as explained below) establishes the values of the first, second and third arcing detection thresholds $L_1$, $L_2$ and $L_3$ and stores the threshold values in a memory within the DSP (Step 100). Alternative methods of establishing the arcing detection thresholds are described below under the heading "Adjusting Arc Detection Thresholds".

In real time, the DSP periodically samples (Step 104) the values of each of the sensor signals $S_1$ (forward RF power signal 25), $S_2$ (reflected RF power signal 27) and $S_3$ (EMF detector signal 48). The term "sample" means to receive the specified electrical signal and store its instantaneous value at a selected point in time, as can be done by a conventional sample-and-hold circuit within the DSP.

The DSP compares the current sampled values of the first, second and third sensor signals $S_1$, $S_2$ and $S_3$ to the first, second and third thresholds $L_1$, $L_2$ and $L_3$, respectively (Step 108). The DSP signals an alert that an arc has occurred (Step 150) if the result of any of these comparisons is positive, that is, if the first sensor signal $S_1$ (forward RF power signal 25) drops below the first threshold $L_1$, if the second sensor signal $S_2$ (reflected RF power signal 27) exceeds the second threshold $L_2$, or if the third sensor signal $S_3$ (EMF detector signal 48) exceeds the third threshold $L_3$.

Preferably, the DSP signals that an arc has occurred (Step 150) by sending an arc alert signal over electrical communications bus 15 to the PLC (FIG. 2D). The PLC can be programmed to specify what remedial action it should perform when it receives an arc alert signal from the DSP (Step 152). Examples of appropriate remedial actions are: (1) to perform the arc suppression algorithm described below in Section 10 entitled "Suppression of Arcing", i.e., Steps 200-206 in FIG. 10; (2) to send a command, via communications bus 16, directing the process controller 34 to shut down the RF power to the plasma chamber immediately; (3) to send a command, via communications bus 16, directing the process controller 34 to wait until completion of processing of the workpiece currently within the plasma chamber, and then shut down the operation of the plasma chamber; or (4) to signal an alarm, via external communications bus 18, to the person operating the chamber and/or log the event in computer memory, but not disrupt operation of the plasma chamber.

After the results $R_i$ of all comparisons become negative—i.e., after all sensor signals $S_i$ return to the "good" side of their respective thresholds $L_i$—the DSP clears or removes the arc alert signal 15 as shown in FIG. 2D at time $t_2$ (Step 110).

3. Sampling Interval and Minimum Arc Duration

The steps of sampling the sensor signals (Step 104) and comparing each sensor signal to its corresponding arc detection threshold (Step 108) are periodically repeated at an interval referred to as the sampling interval $\Delta T$.

If arcing occurs with a duration less than the sampling interval, the sensor signals $S_i$ can change from good to bad and then return to good during the interval between successive samples of the sensor signals (Step 104), in which case the ADSC would not detect that arcing had occurred. Such failure to detect arcing is not necessarily undesirable if the duration of the arcing is too short to create any risk of damaging either the workpiece being manufactured in the plasma chamber or any components of the chamber. Conversely, it is important for the ADSC to reliably detect any arcing of a duration great enough to risk such damage. Therefore, the sampling interval preferably should be no greater than the shortest arc duration that creates a substantial risk of such damage. For the reasons explained below, the sampling interval more preferably is no more than one-fourth or one-tenth of such duration.

Random noise or instability in a sensor signal can cause that sensor signal to briefly cross its respective threshold even though arcing is not occurring. To prevent such noise spikes from being misinterpreted as an occurrence of arcing, the arcing detection algorithm preferably requires a positive comparison result (i.e., a sensor having "bad" values) to persist for at least a minimum time, referred to herein as the minimum arc duration threshold "D", before the arc detection algorithm signals that arcing has occurred. To ensure the detection of potentially damaging arcing events, the minimum arc duration threshold preferably should be no greater than the shortest arc duration that creates a substantial risk of damaging either the workpiece being manufactured in the plasma chamber or any components of the chamber.

Figure 8:
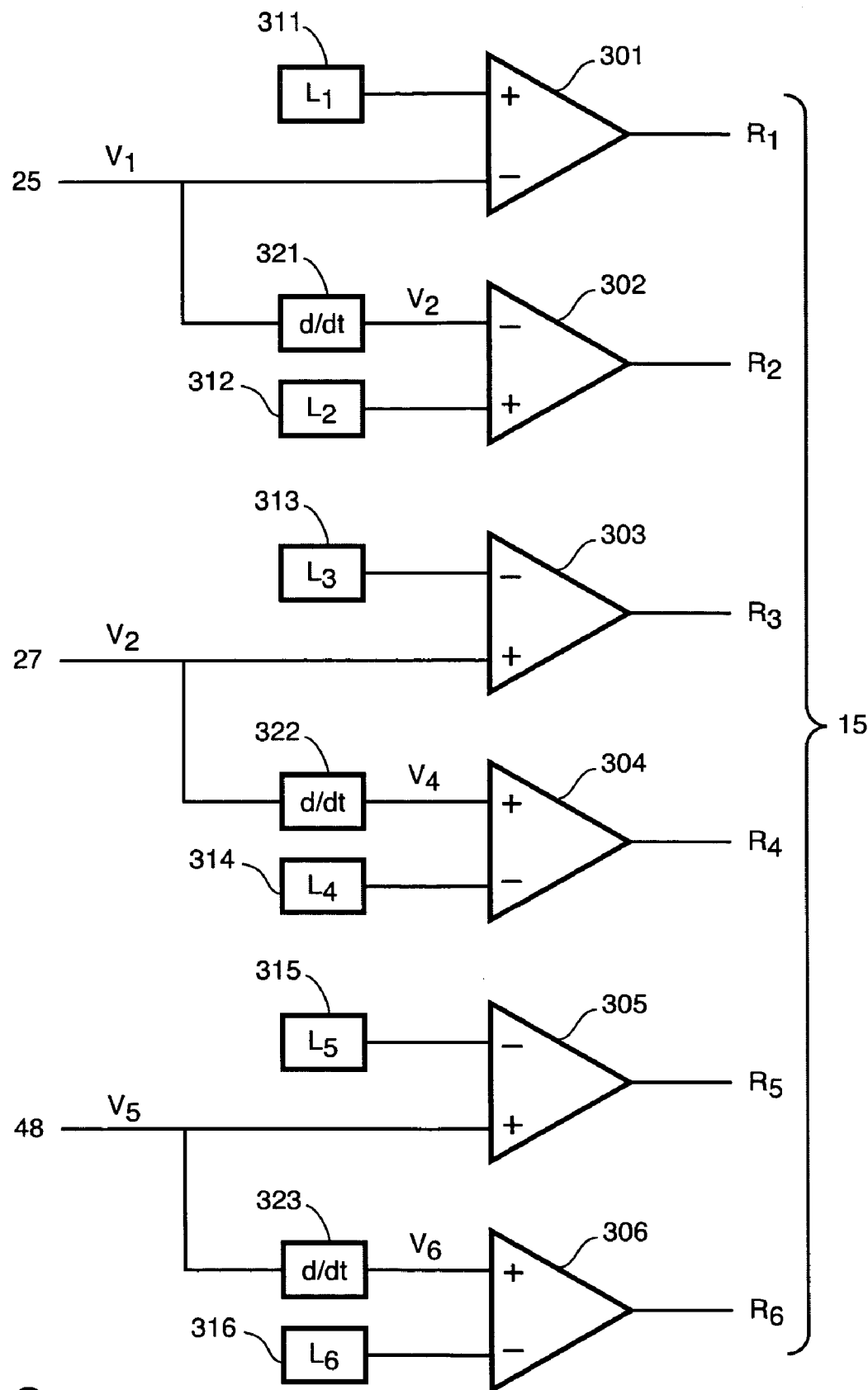
FIG. 8 is a schematic block diagram of a threshold detector implemented with analog voltage comparators.

When the step of comparing each sensor signal to its corresponding threshold is performed by a digital circuit at a periodic sampling interval, as in all embodiments described herein other than the analog comparison circuit of FIG. 8 erroneous arc detection in response to sensor signal noise or instability can be avoided by requiring a positive comparison result (Step 108) to persist for at least a plurality "N" of consecutive sampling intervals. This plurality N, referred to herein as the positive comparison count threshold, preferably is at least three. In our current preferred embodiment, N=10.

The minimum arc duration threshold D will be the product of the sampling interval ΔT and the positive comparison count threshold N. In designing an implementation of the arc detection system, the designer should choose the minimum arc duration threshold and the positive comparison count threshold based on the considerations set forth above. The sampling interval ΔT should be less than or equal to the chosen minimum arc duration threshold D divided by the chosen positive comparison count threshold N.

Figure 4:
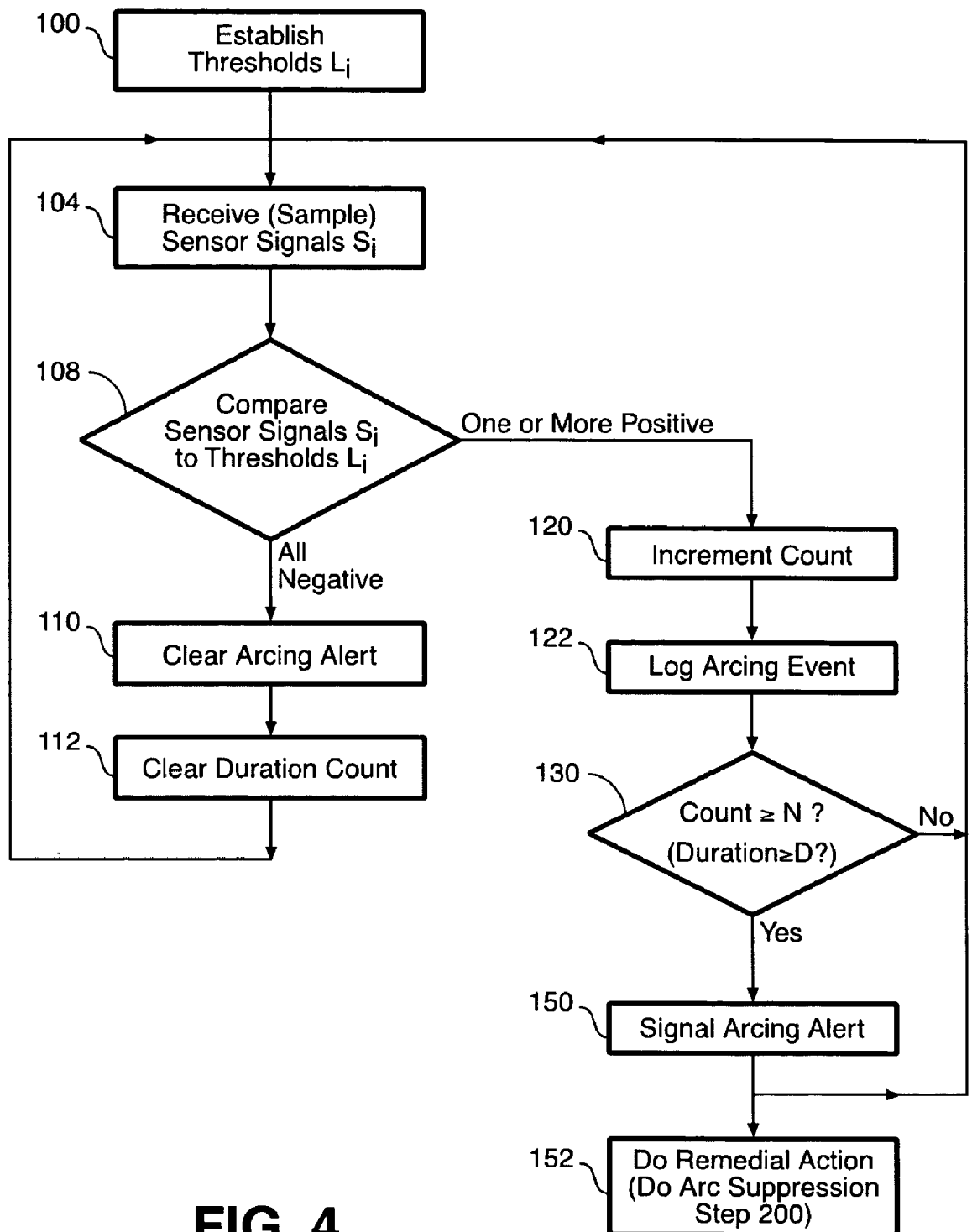
FIG. 4 is a flow chart of an improved arc detection algorithm that rejects identifications of arcing shorter than a minimum duration threshold.

FIG. 4 illustrates an arc detection algorithm that includes Steps 112, 120 and 130 for related to counting the number of positive comparison results and signaling an alert that arcing has occurred only if the count is greater than or equal to the positive comparison count threshold N. The other steps in the algorithm are the same as the previously discussed algorithm of FIG. 3.

Steps 112, 120 and 130 preferably are performed by the DSP. The DSP stores within its memory the positive comparison count threshold N. The DSP also stores within its memory a numerical count whose value is cleared, i.e., reset to zero, whenever all the results $R_i$ of all the comparisons between the sensor signals $S_i$ and their corresponding arc detection thresholds $L_i$ are negative (Step 112). Conversely, in any sampling interval in which at least one such comparison has a positive result, the DSP increments the count stored in its memory (Step 120). Each time it is incremented, the count is compared with the positive comparison count threshold N (Step 130). If the count is equal to or greater than N, the DSP signals an alert via communications bus 15 as described above (Step 150).

The invention was tested with a plasma chamber 30 used for depositing films on a glass substrate used for fabricating flat panel displays having arrays of thin film transistors. These tests suggest that 10 microseconds is a reasonable threshold between arcs that are too short to create damage and arcs that pose a substantial risk of damaging some transistors on the substrate. Therefore, to minimize the risk of false alerts, Step 130 requires a sensor's abnormal output indicating arcing—i.e., one or more positive comparison results in Step 108—to persist for a minimum arc duration threshold D of at least 10 microseconds before signaling an alert that arcing has occurred (Step 150). In the preferred embodiment, the positive comparison count threshold N is 10, and the sampling interval ΔT is 1 microsecond.

If the objective of detecting arcs is primarily to detect arcs of duration great enough to crack or break the workpiece rather than to detect short duration arcs that might damage transistors on the workpiece, the minimum arc duration threshold could be as long as 100 ms or even 1 second, since we have observed that arcs as long as 100 ms typically do not damage a workpiece that is a glass substrate.

The ADSC optionally can store in its memory a log that records the value of the sensor signals every time a comparison has a positive result (Step 122), irrespective of whether the number of positive comparison results is sufficient to signal an arcing alert. Such log may be useful for later analysis to improve the performance of the manufacturing process. There is no need for the log to be updated in real time, so the DSP 14 can send the sensor values to the PLC 12 via the communications bus 15, and then the PLC can store the data in its own memory.

4. Adjusting Arc Detection Thresholds

The value of each arc detection threshold $L_i$ should be stored in a memory within the DSP 14. These values can be established as part of the programming of the DSP 14. More preferably, a person operating the plasma chamber can enter the desired values of the arc detection thresholds $L_i$ into a factory control computer that transmits the threshold values via communications bus 18 to the PLC 12, which then transmits the threshold values $L_i$ to the DSP via bus 15.

Each arc detection threshold $L_i$ should be set to a value between (1) the range of values that the corresponding sensor signal $S_i$ normally would have in the absence of arcing, and (2) the range of values that the corresponding sensor signal $S_i$ typically would have when arcing occurs in the plasma chamber. As illustrated in FIGS. 2B and 2C, the sensor signals $S_i$ in the absence of arcing fluctuate over a range because of noise and instability in the RF power source 20 and in the load impedance of the plasma within the chamber, the latter being caused in part by changes in the plasma chemistry during the progress of the manufacturing process being performed in the plasma chamber.

More specifically, for each sensor measurement whose value increases when an arc occurs, such as reflected RF power $S_2$ and chamber EMF detector signal $S_3$, the corresponding arc detection threshold should be high enough to avoid false detection of an arc when no arc actually occurs, but low enough to avoid failure to detect an arc, i.e., low enough so that any arc is reliably detected. In other words, each arc detection threshold $L_i$ should be low enough so that the corresponding sensor measurement $S_i$ reliably exceeds the corresponding threshold $L_i$ when an arc occurs, and should be high enough so that the corresponding sensor measurement $S_i$ almost never exceeds the threshold $L_i$ in the absence of an arc.

The same principles apply to a sensor measurement whose value decreases when an arc occurs, such as the forward power measurement $S_1$, except that "low" and "below" are interchanged with "high" and "above". That is, the arc detection threshold $L_1$ should be high enough so that the forward power $S_1$ reliably drops below the threshold $L_1$ when an arc occurs, and should be low enough so that the forward power $S_1$ almost never drops below the threshold $L_1$ in the absence of an arc.

The arc detection thresholds $L_i$ can remain fixed throughout the manufacturing process as described above. However, the optimum values of the arc detection thresholds $L_i$ may be different at different steps of the process. Manufacturing processes performed within a plasma chamber often involve a succession of steps in which the RF power level and/or gas chemistry within the chamber change from one step to the next. For example, a process for forming an electronic device on a workpiece may include a plasma-enhanced cleaning step, followed by plasma-enhanced chemical vapor deposition of one material, followed by plasma-enhanced chemical vapor deposition of a different material.

FIGS. 2A-2C illustrate a process in which a first process step is performed during a first time interval $t_0$-$t_3$ at a first RF power level $P_1$ and a second process step is performed during a second time interval $t_3$-$t_4$ at a first RF power level $P_2$. FIG. 2B shows that the arc detection threshold $L_1$ with which the forward RF power signal $S_1$ is compared during the first time interval $t_0$-$t_3$ would be useless during the interval $t_3$-$t_4$ because it is always greater than the forward RF power signal S1, and hence would produce a positive comparison result $R_i$ throughout interval $t_3$-$t_4$, thereby erroneously indicating the occurrence of arcing. To avoid this erroneous outcome, a lower arc detection threshold $L_{1A}$ should be substituted for $L_1$ during the second time interval $t_3$-$t_4$.

One contemplated embodiment of the invention provides a different set of arc detection thresholds $L_i$ at different steps of the manufacturing process by storing within the memory of the PLC a table that specifies for each process step a start time, a stop time, and what the arc detection sensor thresholds $L_i$ should be for each of the sensors being monitored by the DSP. The PLC would transfer to the DSP a new set of sensor thresholds $L_i$ ($L_1$, $L_2$, $L_3$, etc.) at the beginning of each new process step. An advantage of this embodiment is that the threshold values stored in the table can take into account differences in gas chemistry or other operating conditions during each process step, rather than merely basing the threshold values on the RF power level.

However, we have found that basing the arc detection threshold values solely on the value of the RF power set point signal 36 suffices for reliable arc detection. This method has the advantage of not requiring customizing the parameters stored in the memory of the PLC each time it is desired to perform a different manufacturing process in the plasma chamber. Accordingly, in our preferred embodiment the DSP is connected to receive from the chamber process controller 34 the RF power set point signal 36 that the controller sends to the RF power source 20 to control its output power. The RF power set point signal 36 instantaneously indicates to the DSP the intended RF output power at the current step of the process.

Figure 5:
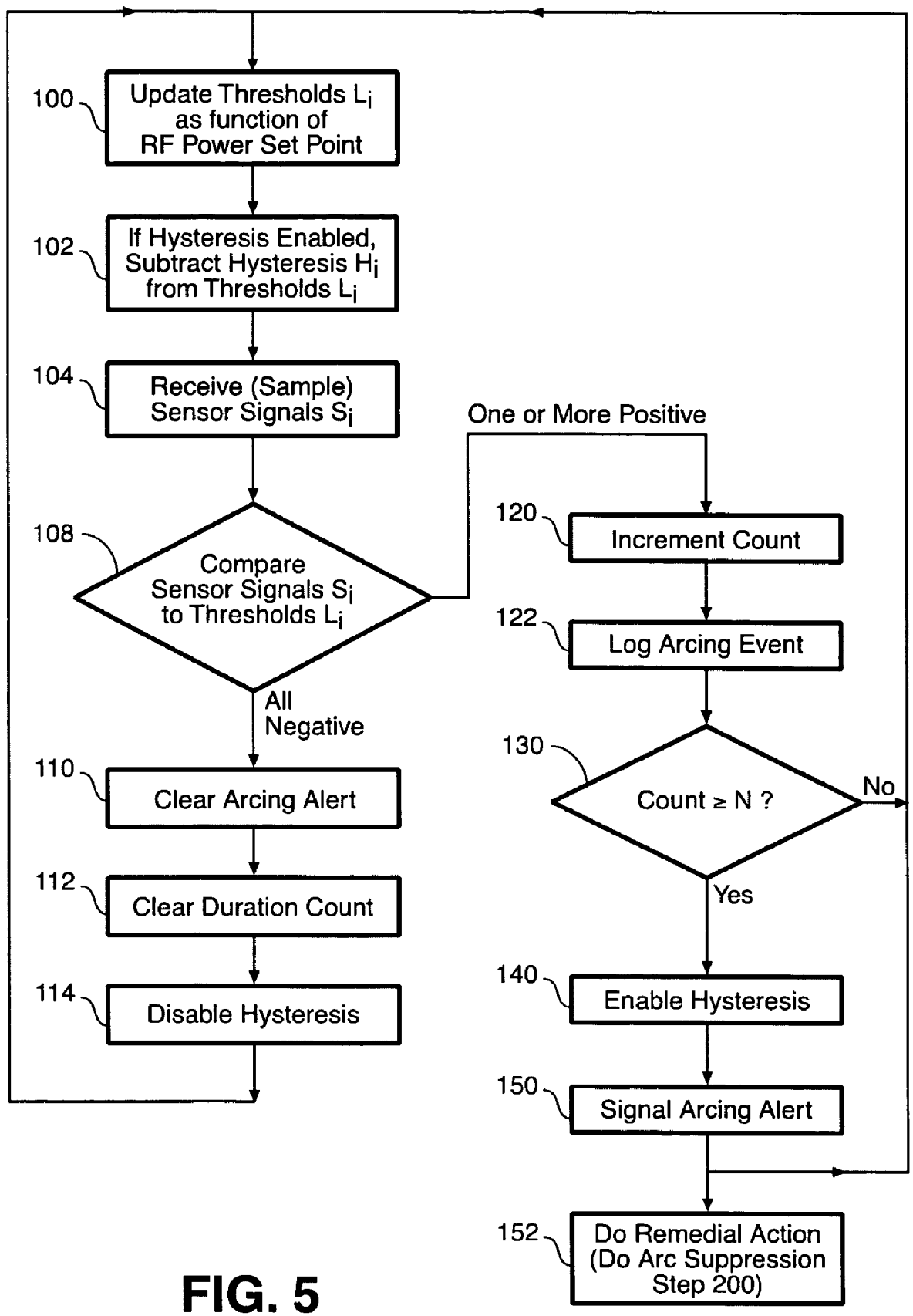
FIG. 5 is a flow chart of a further modified arc detection algorithm that adds hysteresis for the arc detection thresholds and that updates the thresholds at every sampling interval as a function of the power set point of the electrical power supply.

In this embodiment the DSP preferably repeats in every sampling interval the steps of receiving the current value of the RF power set point signal 36 and determining each arc detection threshold $L_i$ as a function of the RF power set point signal, as shown in FIG. 5 (Step 100). The algorithm of this embodiment, shown in FIG. 5, differs from the algorithms of previously described embodiments (FIGS. 3 and 4) in that Step 100 is inside the sequence of steps that is repeated for every sampling interval so that Step 100 is repeatedly performed shortly before the step of comparing each sensor measurement with its corresponding threshold (Step 108). In the preferred embodiment, Steps 100, 104 and 108 are repeated every microsecond.

In a simple but effective implementation, a multiplier constant $K_i$ is associated with each arc detection threshold $L_i$. The thresholds are periodically updated (Step 100) by setting the value of each arc detection threshold $L_i$ ($L_1$, $L_2$, $L_3$, etc.) to the product of its respective multiplier constant $K_i$ ($K_1$, $K_2$, $K_3$, etc.) and the RF power set point, i.e., the current value of the RF power set point signal 36.

To enable the DSP to rapidly update the arc detection thresholds $L_i$ after any change in the RF power set point, the multiplier constants $K_i$ preferably should be stored in the memory of the DSP rather than the slower PLC, and the DSP preferably should perform the multiplication of the thresholds $L_i$ and the multiplier constants $K_i$.

The values of the multiplier constants $K_i$ can be determined empirically. For example, where $S_1$ and $S_2$ are the forward and reflected RF power, suitable values for $K_1$ and $K_2$ may be $K_1$=0.90 and $K_2$=0.03. This means that an arc will be detected if the forward RF power $S_1$ drops below 90% of the RF power set point or the reflected RF power $S_2$ increases above 3% of the RF power set point.

Because multiplying requires much more computing power than adding, subtracting and comparing, avoiding multiplication steps in the arc detection algorithm will enable the use of a less expensive DSP circuit. Consequently, our preferred embodiment does not use the multiplier constants $K_i$ described in the preceding paragraphs or any other multiplying steps. Instead, the DSP determines the arc detection thresholds $L_i$ in response to the RF power set point signal 36 by performing a table look-up. The look-up table is defined by dividing into multiple ranges the various RF power set points that the process controller 34 is expected to specify during processing of a workpiece in the plasma chamber, and then assigning to each power set point range a value for each arc detection threshold $L_i$. Each row in the table includes first and second columns for the minimum and maximum power set points that define the range to which a given table row applies, plus an additional column for each arc detection threshold value $L_i$.

The entire look-up table, i.e., the arc detection thresholds for each range of RF power set points, preferably is stored in the memory of the DSP. The DSP performs Step 100 of the algorithm shown in FIG. 5 by reading the current value of the RF power set point signal 36, determining which table row has minimum and maximum power set point values that are respectively less than and greater than the current set point, and then setting each arc detection threshold $L_i$ to the values specified in the remaining columns of that table row.

For example, Table 1 illustrates a look-up table for an embodiment of the ADSC that uses only a single sensor signal, the reflected RF power signal $S_2$. Table 2 illustrates a subset of the rows of a look-up table for an alternative embodiment of the ADSC that uses two sensor signals, the forward RF power signal $S_1$ and the reflected RF power signal $S_2$.

TABLE 1

| RF Power Set Point Range (watts) | | |
|---|---|---|
| Minimum | Maximum | $L_2$ (watts) |
| 0 | 2000 | 50 |
| 2001 | 4000 | 75 |
| 4001 | 6000 | 100 |
| 6001 | 8000 | 200 |
| 8001 | 10000 | 300 |

TABLE 2

| RF power set point range (watts) | | | |
|---|---|---|---|
| Minimum | Maximum | $L_1$ (watts) | $L_2$ (watts) |
| 1801 | 1900 | 1600 | 60 |
| 1901 | 2000 | 1700 | 60 |
| 2001 | 2100 | 1800 | 60 |
| 2101 | 2200 | 1900 | 60 |
| 2201 | 2300 | 2000 | 60 |
| 3901 | 4100 | 3500 | 120 |
| 4101 | 4300 | 3700 | 120 |

Besides showing Step 100 being inside the loop of steps that the DSP executes at every sampling interval, FIG. 5 further differs from FIGS. 3 and 4 in that is shows Step 106 related to the feature of deriving values from the sensor signals, described below, and Steps 102, 114 and 140 related to the hysteresis feature described below. Each of these features is an optional aspect of the present invention that can be included independently of whether the others are included, not withstanding that they are included together in FIG. 5.

Although FIG. 5 shows the arc detection thresholds $L_i$ being updated at every sampling interval (Step 100), the arc detection thresholds can be updated at a somewhat slower rate, in which case it may be possible for Step 100 to be performed by the slower PLC rather than the DSP. In this alternative embodiment, the PLC receives the RF power set point signal 36, establishes the values of the arc detection thresholds $L_i$, and transmits the threshold values to the PLC via communications bus 15. The PLC can perform these steps asynchronously relative to the sampling interval to which the DSP is synchronized in performing the steps of sampling the sensor signals and comparing them with the arc detection thresholds (Steps 104-140).

5. Hysteresis in Arc Detection Thresholds

An optional further improvement to the arc detection algorithm described above is to add hysteresis to the arc detection thresholds, by which we mean establishing different thresholds for identifying the start of arcing and the end of arcing. FIG. 5 shows an embodiment of the algorithm performed by the ADSC that includes the hysteresis feature.

When the DSP determines that arcing has begun and sends an arc alert signal to the PLC or an external device (Step 150), the DSP enables a hysteresis mode (Step 140). The DSP preferably sets or clears a binary bit (a "flag") in its memory to indicate whether the hysteresis mode is enabled.

While the hysteresis mode is enabled, the DSP will subtract from each arc detection threshold $L_i$ a corresponding hysteresis offset $H_i$ (Step 102) each time the DSP compares the current sensor signals to the arc detection thresholds (Step 108). The subtraction can be a separate step as shown in FIG. 5, or it can be part of the comparison operation (Step 108).

Each hysteresis offset $H_i$ should be a positive number if its corresponding threshold $L_i$ is greater than the normal or "good" values of its corresponding sensor signal $S_i$, and should be a negative number if its corresponding threshold $L_i$ is less than the normal or "good" values of its corresponding sensor signal $S_i$. Therefore, the effect of the hysteresis offset is that the DSP requires each sensor signal to return closer to its normal or ideal value before the DSP will recognize an arcing event as having ended (Step 110).

When the results $R_i$ of all comparisons (Step 108) are negative and the DSP removes (clears) the arc alert signal (Step 110), the DSP also disables the hysteresis mode (Step 114) so that the hysteresis offsets no longer are subtracted from the arc detection thresholds (Step 102).

The hysteresis offsets can be included in the programming of the DSP or can be transmitted by the person operating the chamber to the PLC via bus 18. More preferably, if the arc detection thresholds are stored in a look-up table as described above, the hysteresis offsets can be stored in the same table. We presently prefer a hysteresis value of 25 watts for both of the arc detection thresholds respectively corresponding to the forward RF power and the reflected RF power sensor signals.

6. Disabling Arc Detection During Process Transitions

We have found that when the RF power is first turned on, or when the RF power set point steps to a higher or lower level, the sensor measurements $S_i$ can temporarily change in a manner similar to their changes when an arc occurs. Specifically, when the RF power set point increases, the forward RF power $S_1$ can fail to increase at the same rate as the RF power set point 36. When the RF power set point either increases or decreases, the resultant change in the plasma within the chamber can produce a temporary surge in both the reflected RF power $S_2$ and the chamber EMF signal $S_3$. To avoid this behavior being erroneously identified as an arc, a preferred embodiment of our invention disables the ADSC from performing the arc detection algorithm of FIGS. 3-5 during these periods of rapid change in the RF power set point.

Specifically, when the RF power is first turned on, the ADSC does not begin performing the arc detection algorithm until after a predetermined initial suspension period which preferably exceeds the time required for the RF power to increase to its final value and stabilize. Likewise, the ADSC also suspends its performing of the arc detection algorithm whenever the RF power set point signal 36 steps to a higher or lower value, as illustrated in FIG. 2A at times $t_0$ and $t_3$, or otherwise rapidly changes. Preferably the suspension period is at least 70 ms, more preferably at least 100 ms.

The DSP preferably is programmed to monitor the RF power set point signal 36 and detect when it changes substantially. In that event, the DSP should initiate a suspension of the arc detection algorithm for the predetermined suspension period stored in the memory of the DSP. During the suspension period, the DSP can update the arc detection thresholds $L_i$ in response to the new value of the RF set point (Step 100 of FIG. 3 or 4). When the suspension period ends, the DSP should resume performing the arc detection algorithm at Step 104.

In this embodiment of the invention, because Steps 102-152 of the arc detection algorithm are suspended whenever the RF power set point changes substantially, there is no need to perform the step of updating the arc detection thresholds, Step 100, except during each suspension period. Therefore, it would not make sense to repeat Step 100 in every sampling interval as in the embodiment of the algorithm shown in FIG. 5.

7. Deriving Values from Sensor Signals

Figure 6:
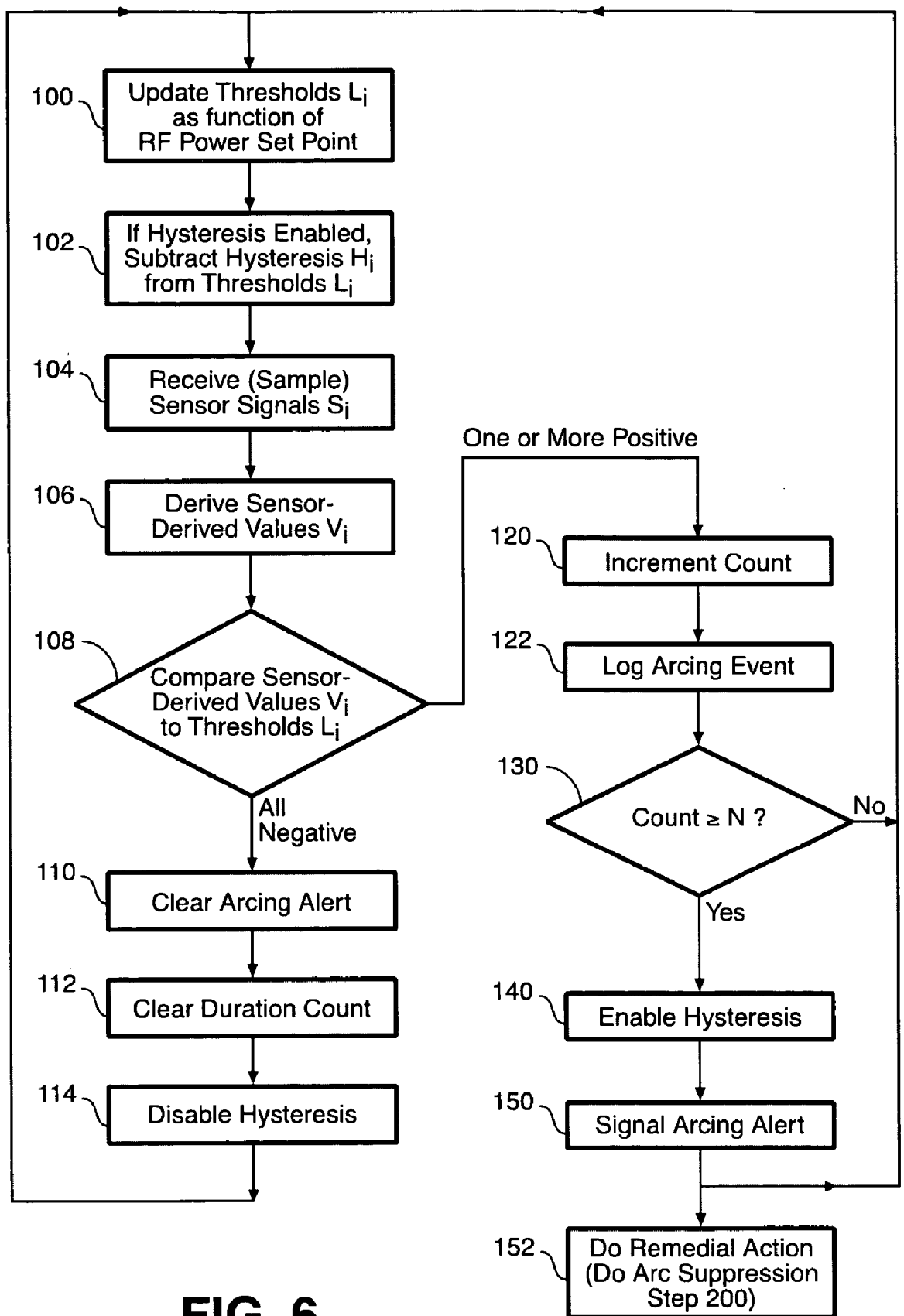
FIG. 6 is a flow chart of the algorithm of FIG. 5 modified to compare the arc detection thresholds with values derived from the sensor signals.

Besides directly monitoring the sensor signals $S_i$ as described above, it can be useful to monitor one or more values $V_i$ that we refer to as "sensor-derived values", where each sensor-derived value is derived from (i.e., is a function of) one or more actual sensor signals $S_i$. FIG. 6 shows the arc detection algorithm of FIG. 5 modified to add the step of deriving values from sensor signals (Step 106). In the comparison step (Step 108), each arc detection threshold $L_i$ is compared with a corresponding sensor-derived value $V_i$ instead of with a sensor signal $S_i$ as in FIG. 5.

Examples of useful sensor-derived values are: (1) the sum or average of multiple sensor signals; (2) the ratio between two sensor signals, such as the ratio between the reflected RF power 27 and the forward RF power 25; and (3) the slope or time derivative of one of the sensor signals, such as the slope of the reflected RF power signal 27.

In addition, any of the sensor-derived values $V_i$ can simply equal one of the sensor signals $S_i$, so that the step of comparing a sensor-derived value with an arc detection threshold (FIG. 6, Step 108) is a generalization of, rather than an alternative to, the step of comparing a sensor signal to an arc detection threshold (FIGS. 3-5, Step 108). Consequently, the FIG. 6 algorithm encompasses, and is a generalization of, the FIG. 5 algorithm.

As in the arc detection algorithms discussed above, if a given sensor-derived value $V_i$ normally is less than its corresponding arc detection threshold $L_i$ in the absence of arcing, than the result $R_i$ of the comparison in Step 108 is considered positive or negative according to whether the sensor-derived value $V_i$ is greater than or less than the threshold $L_i$. Conversely, if a given sensor-derived value $V_i$ normally is greater than the threshold $L_i$ in the absence of arcing, then the result $R_i$ of the comparison is considered positive or negative according to whether the sensor-derived value $V_i$ is less than or greater than the threshold $L_i$.

A combination of sensor-derived values we have found especially effective for detecting arcing is to define a first sensor-derived value $V_1$ as equal to the reflected RF power signal 27 and a second sensor-derived value $V_2$ as equal to be the slope of the reflected RF power signal. In the embodiment of FIG. 1, the DSP can be programmed to mathematically compute the slope of the reflected RF power signal based on samples of the reflected RF power signal. Mathematical algorithms for computing the slope of a signal as a function of successive samples of that signal are well known. Alternatively, the embodiment of FIG. 8, described in Section 9, below, employs an analog slope detector circuit to produce a signal proportional to the slope of the reflected RF power signal.

8. Distinguishing Long and Short Arcing Duration

Because the severity of damage caused by arcing increases with the duration of the arcing, it may be desirable for the ADSC to distinguish between short and long duration arcing. For example, in plasma chambers for fabricating flat panel displays on glass substrates, arcing longer than 10 microseconds poses a risk of damaging a transistor in the display, while arcing longer than 1 second poses a risk of cracking the glass substrate. It may suffice to record the occurrence of a 10 micro-second arc in a log, but an arc of 0.1 second duration may require immediately shutting down the operation of the plasma chamber to prevent a possibly broken substrate from damaging other chamber components.

Figure 7:
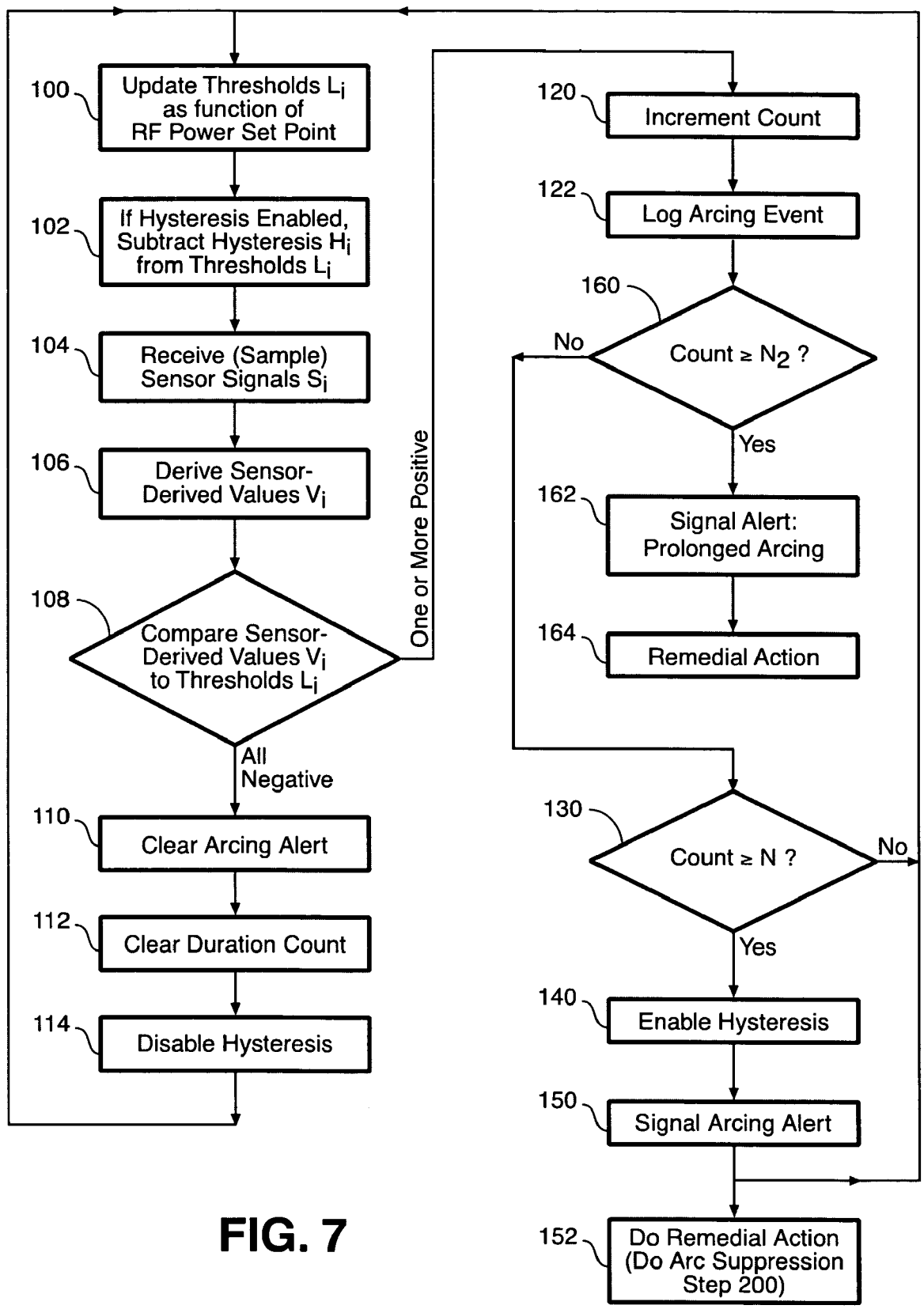
FIG. 7 is a flow chart of a further improved algorithm that adds steps for detecting whether arcing persists for longer than a specified duration.

FIG. 7 shows a variation of the arcing detection algorithm of FIG. 6 which includes additional steps 160-164 for detecting whether any arcing persists for at least $N_2$ successive samples, where $N_2$ is an integer greater than the minimum positive result count N, preferably at least ten times greater. For example, if the sampling interval is 1 microsecond, then $N_2$ should be $10^5$ to signal arcing of duration greater than 0.1 second.

Steps 160-164 preferably are performed by the DSP, which stores the value of $N_2$ in its memory. The same count used in Steps 112, 120 and 130 of the algorithms of FIGS. 4-6 is compared with $N_2$ in Step 160. If the count is greater than or equal to $N_2$, the DSP signals that a prolonged arc has occurred (Step 162), preferably by sending a signal to the PLC over bus 15. The PLC then can initiate remedial action (Step 164), such as shutting down the plasma chamber, that is more severe than the remedial action taken in response to arcing of shorter duration (Step 152).

9. Analog Threshold Detector Circuit

FIG. 8 shows an analog threshold detector circuit that can be substituted for the DSP 14 in FIG. 1. The threshold detector circuit employs a conventional analog comparator circuit or operational amplifier 301-306 for each sensor signal $S_1$ or sensor-derived value $V_1$ that is to be compared with a respective arc detection threshold $L_i$ in the arc detection algorithm. The output of each comparator circuit 301-306 is the result $R_1$-$R_6$ of the corresponding comparison (Step 108 of the arc detection algorithm of any of FIGS. 3-7).

The threshold detector circuit shown in FIG. 8 has six comparator circuits which compare six sensor-derived values to six respective arc detection thresholds $L_1$-$L_6$. However, the illustrated circuit can perform comparisons with any number of sensor-derived values or sensor signals, including only one, and in that case would include a number of comparator circuits equal to the total number of sensor-derived values and sensor signals to be independently compared to respective arc detection thresholds, i.e., equal to the number of distinct comparison results $R_i$ to be produced in Step 108.

The threshold detector circuit is connected to receive each of the sensor signals $S_i$ that would be connected to the DSP 14 in the FIG. 1 embodiment (Step 104). Three of the sensor-derived values $V_1$, $V_3$ and $V_5$ received by respective comparator circuits 301, 303 and 305 in the FIG. 8 embodiment are the same as the sensor signals $S_1$, $S_2$ and $S_3$ in the previously described embodiments, namely, the forward RF power signal 25, the reflected RF power signal 27, and the EMF detector signal 48 (Step 104). The additional sensor-derived values $V_2$, $V_4$ and $V_6$ received by respective comparator circuits 302, 304 and 306 are the respective slopes of those signals. We have found an increase in the magnitude of the slope of a sensor signal to be a useful indicator of the occurrence of arcing.

The slopes are derived by connecting each sensor signal 25, 27, 48 to the input of a respective slope detector circuit 321, 322, 323 (Step 106). The output of each slope detector connects to an input of the respective comparator 302, 304, 306. The slope detectors are commercially available circuits that include a differentiator circuit followed by a low pass filter.

Each comparator circuit 301-306 has a positive input and a negative input. One input of each comparator circuit is connected to receive a voltage signal proportional to the desired sensor signal $S_i$ or sensor-derived value $V_i$. The other input is connected to receive a voltage signal proportional to the corresponding arc detection threshold $L_i$. The latter voltage is produced by a respective threshold adjustment circuit 311-316.

Figure 9:
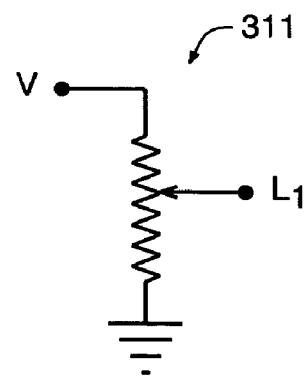
FIG. 9 is an electrical schematic of a threshold adjustment circuit having a potentiometer.

Each threshold adjustment circuit 311-316 can simply be a fixed voltage source connected to a potentiometer 60 that is manually adjusted to establish the desired arc detection threshold $L_i$ as shown in FIG. 9. Preferably, the potentiometer can be replaced by a digitally controlled resistor ladder network 60 which functions as a digitally controllable potentiometer. The digital control inputs of the ladder network 60 preferably are connected to the PLC 12 via communications bus 15, thereby allowing the PLC to adjust each threshold (Steps 100 and 102 in FIGS. 3-7).

A sensor signal $S_i$ or sensor-derived value $V_i$ that normally is less than its corresponding arc detection threshold in the absence of arcing, and that increases in response to arcing, should be connected to the positive input of its corresponding comparator circuit. Its corresponding threshold adjustment circuit should be connected to the negative input. Examples are the reflected RF power signal 27 (FIG. 2C), its slope $V_4$, the EMF detector signal 48, and its slope $V_6$. Conversely, a sensor signal $S_i$ or sensor-derived value $V_i$ that normally is greater than its corresponding arc detection threshold in the absence of arcing, and that decreases in response to arcing, should be connected to the negative input of its corresponding comparator circuit. Its corresponding threshold adjustment circuit should be connected to the positive input. Examples are the forward RF power signal 25 (FIG. 2B) and its slope $V_2$.

This embodiment, in which the analog threshold detector circuit of FIG. 8 is substituted for the DSP 14 in FIG. 1, can be used to perform any of the variations described above of the arc detection algorithms shown in FIGS. 3-7. The analog threshold detector circuit of FIG. 8 performs Steps 104, 106 and 108 of the arc detection algorithm as described above, and the PLC 12 is programmed to perform the other steps of the algorithm. Because the analog threshold detector circuit performs the comparisons continuously instead of at sampling intervals, Steps 102-140 which are shown in FIGS. 3-7 as being performed repeatedly in a flow chart loop can be performed continuously with the analog threshold detector circuit. If the comparison results $R_i$ produced by the analog threshold detector circuit are connected to interrupt inputs of the PLC, the PLC can respond immediately to a positive result $R_i$ (Steps 120-152) rather than responding only after a sampling or polling interval has elapsed.

10. Suppression of Arcing

In addition to detecting arcs as described above, the ADSC 10 preferably is programmed to implement an algorithm for suppressing arcs, by which we mean minimizing the duration of an arc after the ADSC has detected the arc. In brief, our method of arc suppression is to turn off the RF power provided by the RF power source 20 to the plasma chamber for a short time, which usually quenches (stops) the arcing, and then return the RF power to its previous level.

The circuit shown in FIG. 1 is capable of implementing our arc suppression method. The RF power source 20 includes an "enable" input 23 which receives a binary signal whose on and off states determine whether the output of the RF power source is on or off. When the enable input signal 23 is in the "on" state, the RF power source outputs a power level designated by the RF power set point input 21 as described above. When the enable input signal 23 is in the "off" state, the RF power source provides zero power at its output 22 regardless of the RF power set point signal 21.

The ADSC 10, preferably the DSP 14, produces a binary RF power enable signal 70 that is connected to the enable input 23 of the RF power source. Normally, the DSP maintains the RF power enable signal in the "on" state so that the RF power source outputs whatever level of RF power is designated by the RF power set point signal 36 from the process controller 34.

Figure 10:
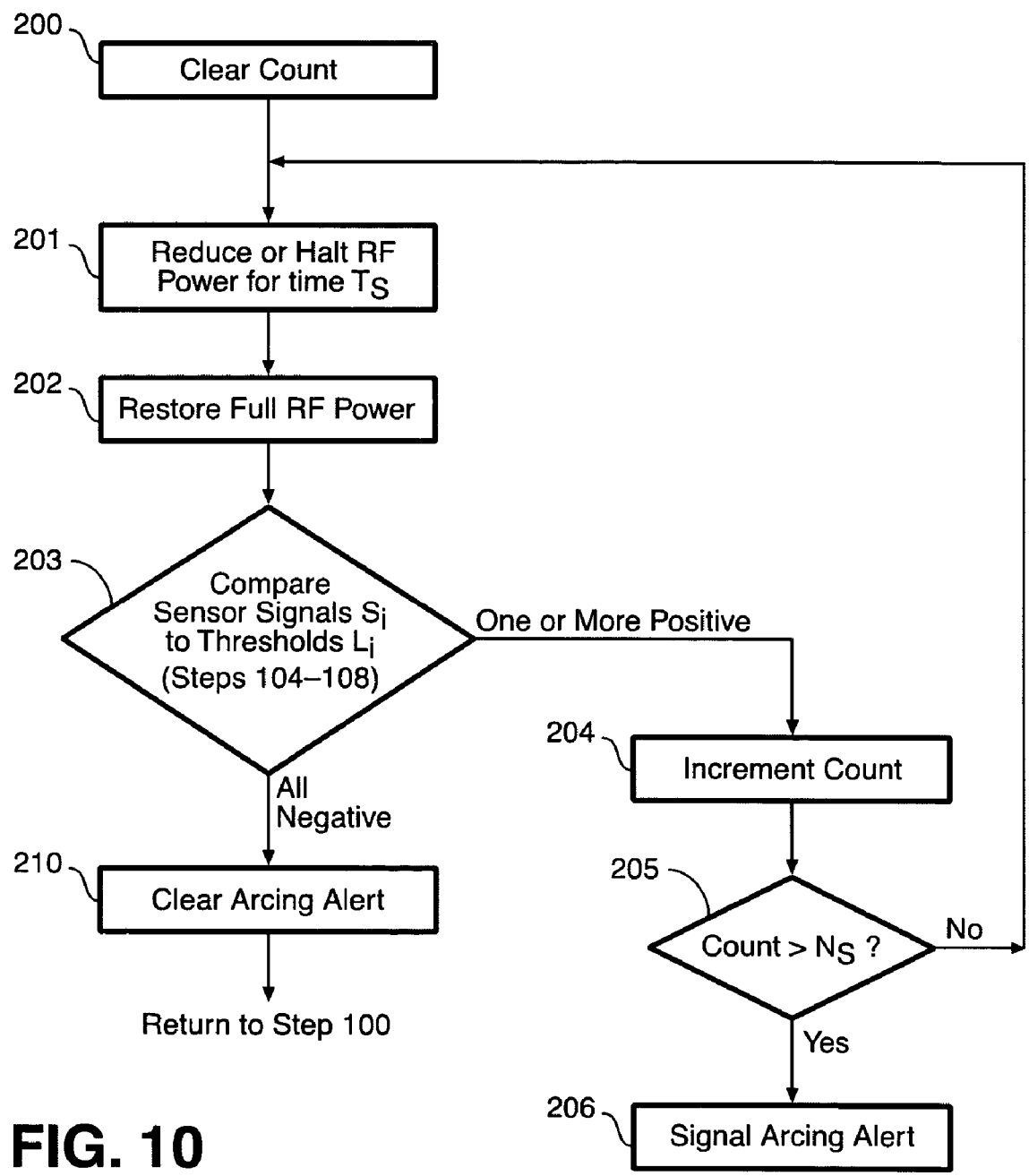
FIG. 10 is a flow chart of an arc suppression algorithm.

The arc suppression algorithm performed by the circuit of FIG. 1 is shown in FIG. 10.

The arc suppression algorithm is not performed unless the previously described arc detection algorithm (Steps 100-150 of FIGS. 3-7) detects arcing (Step 150).

When the arc detection algorithm performed by the DSP determines that arcing is occurring (Steps 150-152), the DSP begins performing the arc suppression algorithm by clearing (resetting to zero) a count "C" stored in the memory of the DSP that represents the number of attempts to quench the arc (Step 200). At this time the DSP also changes the RF power enable signal 70 to the "off" state, which commands the RF power source 20 to reduce its power output 22 to zero (Step 201). Steps 200 and 201 can be performed simultaneously or in either order.

The DSP maintains the RF power enable signal 70 in the "off" state for a predetermined time period referred to as the arc suppression time period $T_S$ (Step 201). The duration of the time period $T_S$ preferably is long enough to achieve a non-negligible likelihood that the arcing will remain quenched—i.e., the arcing will not resume—when the original RF power is restored after this time period $T_S$.

In the preferred embodiment, the default value of the arc suppression time period $T_S$ is 2 milliseconds. More generally, the time period $T_S$ preferably is less than or equal to 20 ms, and more preferably less than or equal to 5 ms.

After the expiration of the reduced power time period $T_S$, the DSP changes the RF power enable signal 70 to the "on" state (Step 202), in response to which the output 22 of the RF power source 20 returns to the power level designated by the RF power set point signal 36 from the process controller 34, i.e., the RF output power returns to its normal level for the current step of the process being performed in the chamber.

After the RF power is restored, the DSP tests whether the arcing has been quenched (eliminated) by performing Steps 104-108 of the arc detection algorithm of FIGS. 3-7 (Step 203). If all of the comparisons in Step 108 have a negative result, the arc suppression is considered to have succeeded ("All Negative" outcome of Step 203 in FIG. 10). Accordingly, the DSP clears any arcing alert signal that may have been set in Step 150 (Step 210), and discontinues performing the arc suppression algorithm of FIG. 10 and resumes performing the arc detection algorithm of FIGS. 3-7, beginning at Step 100.

Conversely, if any of the comparisons in Step 108 have a positive result, the arc suppression is considered unsuccessful ("One or More Positive" outcome of Step 203), either because the arcing never stopped or because the arcing recurred when the RF power returned to its normal level. In either case, the DSP increments by one the aforesaid count "C" stored in its memory (Step 204), so that the count indicates the number of times Step 201 was performed in an unsuccessful attempt to suppress the present arcing.

Next, the DSP compares the count "C" to a predetermined maximum permitted number $N_S$ that also is stored in the memory of the DSP (Step 205). If the number of unsuccessful attempts to suppress the arc is less than or equal to the maximum permitted number $N_S$ ("No" outcome of Step 205), then the DSP repeats the arc suppression algorithm beginning with Step 201, bypassing the step of clearing the count in Step 200.

Conversely, if the number of unsuccessful attempts to suppress the arc is greater than the maximum permitted number $N_S$ ("Yes" outcome of Step 205), the DSP sends an arc alert signal to the PLC via communications bus 15 (Step 206), in response to which the PLC can be programmed to take remedial action. Examples of such remedial actions are the remedial actions (2)-(4) described near the end of the preceding Section 2 entitled "Detection of Arcing".

A possible variation of the described algorithm would be to employ a criterion other than a fixed number of attempts $N_S$ to determine when to stop repeating the arc suppression algorithm in Step 205, or even to omit any such criterion (Steps 204 and 205) and simply continue the arc suppression algorithm indefinitely until the arcing is eliminated.

If the RF power source does not have an "enable" input 23, the arc suppression algorithm can be implemented by interposing an AND gate, switch, or multiplexor (MUX) 40 between the RF power set point output 36 of the process controller 34 and the power set point input 21 of the RF power source 20.

Figure 11:
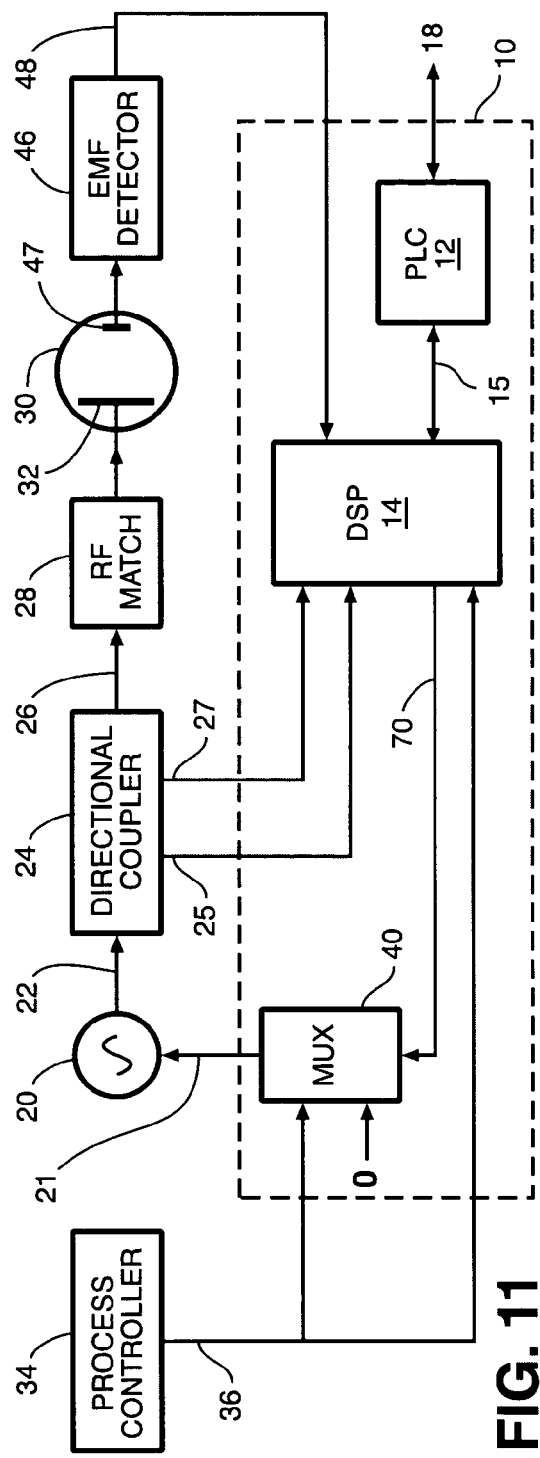
FIG. 11 is an alternative embodiment of the circuit of FIG. 1 including a multiplexor connected to the RF set point input of the RF power source.

FIG. 11 shows an embodiment using a multiplexor 40 having two data inputs. The first data input is connected to receive the RF power set point signal 36 produced by the process controller 34; its value represents the RF power that the process controller determines is desired at the current step in the process being performed in the plasma chamber 30. The second data input of the multiplexor is connected to a fixed electrical voltage representing a set point power of zero (shown as a zero character "0" in FIG. 11).

The AND gate, switch, or multiplexor 40 has a control input connected to receive the "RF power enable" binary signal 70 from the DSP 14. When the RF power enable signal is in its "on" state, the AND gate, switch, or multiplexor 40 connects the RF power set point signal 36 to the power set point input 21 of the RF power source 20. When the RF power enable signal is in its "off" state, the AND gate, switch, or multiplexor 40 couples the aforesaid zero value to the power set point input 21.

FIG. 2E shows the power set point input 21 alternating between its normal value and zero during the time interval $t_1$-$t_2$ when the DSP is performing the arc suppression algorithm. FIG. 2E also shows the power set point input 21 at a high level during time intervals $t_0$-$t_1$ and $t_2$-$t_3$ during the absence of arcing, and at a lower level dictated by the process controller 34 during time interval $t_3$-$t_4$.

A possible variation of the design shown in FIG. 11 is to suppress the arcing by reducing the RF power to a level greater than zero but substantially lower than the set point power specified by the set point signal 36 provided by the process controller 34. This can be implemented by replacing the zero signal "0" connected to the second input of the multiplexor 40 with a voltage source whose value represents such reduced power level.

Figure 12:
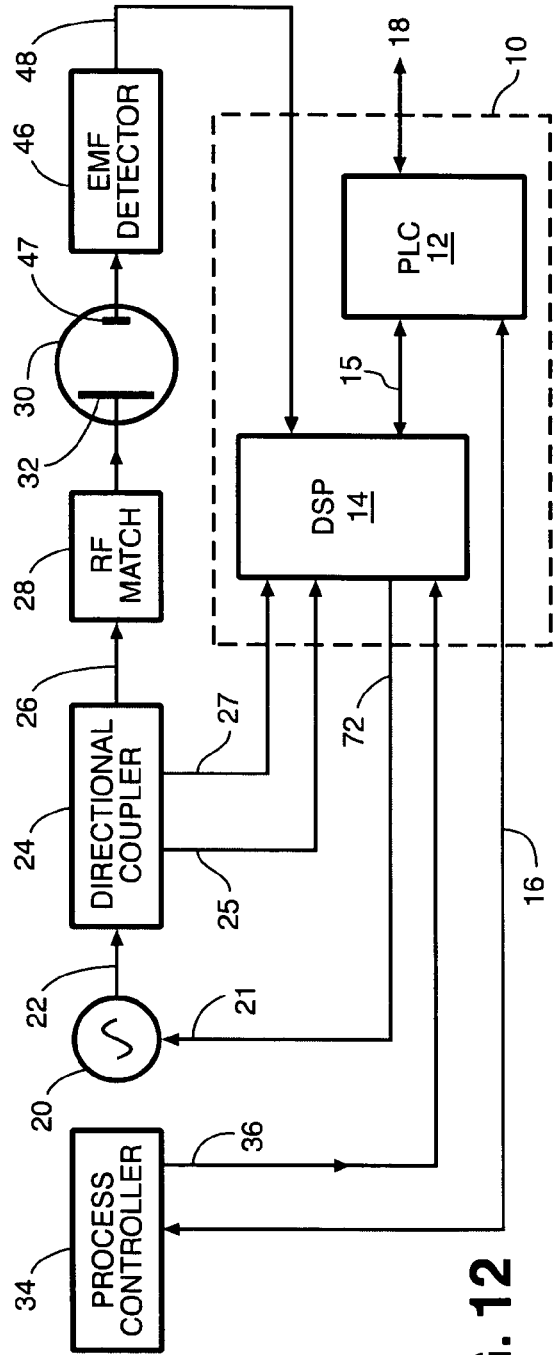
FIG. 12 is another alternative embodiment of the circuit of FIG. 1 in which the DSP provides a power set point signal to the RF power source.

FIG. 12 shows a further variation in which the DSP is programmed to generate an RF power set point signal 72 that is connected to the set point input 21 of the RF power source 20, eliminating the need for the multiplexor 40 and the connection between the process controller 34 and the RF power source 20. In the embodiment of FIG. 12, the DSP is programmed to set the power set point signal 72 to the same value as the power set point signal 36 received by the DSP from the process controller during times when the DSP would have set the RF power enable signal 23 to its "enable" value in the embodiments of FIGS. 1 and 11. Conversely, during times when the DSP would have set the RF power enable signal 23 to its "disable" value in the embodiments of FIGS. 1 and 11, the DSP in the embodiment of FIG. 12 is programmed to set the power set point signal 72 either to zero or to a reduced level to suppress arcing as described in the preceding paragraph.

The invention claimed is:

1. A method of detecting an abnormal change in an electrical load to which a power source supplies electrical power, comprising the steps of:
   supplying RF power from a power source to an electrical load;
   producing a reflected RF power sensor signal responsive to reflected RF power between the power source and the load;
   comparing said reflected RF power sensor signal to a threshold; and
   discontinuing the supplying of RF power to the electrical load if said reflected RF power sensor signal exceeds the threshold;
   wherein
   the electrical load is a plasma chamber; and
   the power source supplies RF power to the plasma chamber such that the RF power sustains a plasma in the plasma chamber.

2. A method of detecting an abnormal change in an electrical load to which a power source supplies electrical power, comprising the steps of:
   supplying RF power from a power source to an electrical load;
   producing a reflected RF power sensor signal responsive to reflected RF power between the power source and the load;
   comparing the rate of change of said reflected RF power sensor signal to a threshold; and
   discontinuing the supplying of RF power to the electrical load if the rate of change of said reflected RF power exceeds the threshold.

3. The method of claim 2, wherein:
   the electrical load is a plasma chamber; and
   the power source supplies RF power to the plasma chamber such that the RF power sustains a plasma in the plasma chamber.

4. A method of detecting an abnormal change in an electrical load to which a power source supplies electrical power, comprising the steps of:
   producing a power set point signal;
   supplying electrical power from a power source;
   controlling the power source so that the electrical power supplied by the power source has a level responsive to the power set point signal;
   coupling said electrical power to an electrical load;
   producing one or more sensor signals, wherein each sensor signal is responsive to said electrical power or to an electromagnetic condition of the load;
   establishing one or more sensor-derived values, wherein each sensor-derived value is a function of one or more of the sensor signals;
   establishing one or more thresholds so that each threshold is associated with one of said sensor-derived values;
   comparing each sensor-derived value to its associated threshold; and
   signaling an alert if at least one of the sensor-derived values crosses its associated threshold;
   wherein, concurrently with the step of supplying electrical power, the step of establishing one or more thresholds comprises the steps of:
   monitoring the power set point signal; and
   adjusting at least one of the thresholds in response to the power set point signal.

5. The method of claim 4, wherein:
   the step of establishing one or more thresholds further comprises establishing the thresholds so that each sensor-derived value normally does not cross its associated threshold in the absence of electrical arcing in the load.

6. The method of claim 5, wherein:
   the step of establishing one or more thresholds further comprises establishing the thresholds so that each sensor-derived value is likely to cross its associated threshold if electrical arcing occurs in the load.

7. The method of claim 4, wherein one of the sensor-derived values is one of the sensor signals.

8. The method of claim 4, wherein one of the sensor-derived values is the rate of change of one of the sensor signals.

9. The method of claim 4, wherein the step of establishing one or more thresholds comprises adjusting at least one of the thresholds to be proportional to the power set point signal.

10. The method of claim 4, further comprising the step of:
    storing in a memory a table that defines a plurality of ranges of power set point values, and that associates with each range respective values for one or more of said thresholds;

wherein the step of establishing one or more thresholds further comprises the steps of:

determining the current value of the power set point signal; and setting the respective values of one or more of the thresholds to the values stored in the table that are associated with a range of power set point values that includes the current value of the power set point signal.

11. The method of claim 4, wherein:

the sensors comprise a first sensor responsive to reflected RF power between the power source and the load;

the sensors comprise a second sensor responsive to forward RF power between the power source and the load; and one of the sensor-derived values is the ratio between the reflected RF power sensed by the first sensor and the forward RF power sensed by the second sensor.

12. The method of claim 4, wherein the step of signaling an alert comprises:

discontinuing the coupling of said electrical power to the electrical load.

13. A method of detecting an abnormal change in an electrical load to which a power source supplies electrical power, comprising the steps of:

supplying electrical power from a power source to an electrical load;

producing one or more sensor signals, wherein each sensor signal is responsive to said electrical power or to an electromagnetic condition of the load;

establishing one or more sensor-derived values, wherein each sensor-derived value is a function of one or more of the sensor signals;

establishing one or more thresholds so that each threshold is associated with one of said sensor-derived values;

comparing each sensor-derived value to its associated threshold; and signaling an alert if at least one of the sensor-derived values crosses its associated threshold;

wherein each of said sensor-derived values is characterized by a normal range of values in the absence of an abnormal change in the load; and the step of signaling an alert further comprises the step of changing at least one of the thresholds to a value closer to the normal range of values of the sensor-derived value associated with that threshold.

14. The method of claim 13, further comprising the steps of, subsequent to the step of changing at least one of the thresholds to a value closer to said normal range:

performing the comparing step until every sensor that previously crossed its associated threshold crosses back to the original side of its associated threshold; and then restoring to their original values every threshold that was changed in the step of changing at least one of the thresholds to a value closer to said normal range.

15. The method of claim 14, wherein:

the step of signaling an alert comprises discontinuing the supplying of said electrical power to the electrical load; and the restoring step further comprises the step of resuming the supplying of said electrical power to the electrical load.

16. The method of claim 13, wherein the step of signaling an alert comprises:

discontinuing the supplying of said electrical power to the electrical load.

17. An electrical circuit for detecting an abnormal change in an electrical load to which a power source supplies power, comprising:

one or more sensors, wherein each sensor produces a sensor signal responsive to said electrical power or to an electromagnetic condition of the load;

a sensor signal receiving circuit for receiving each sensor signal and for producing one or more sensor-derived signals so that the value of each sensor-derived signals is a function of one or more of the sensor signals;

a threshold adjustment circuit adapted to receive a power set point signal, wherein the threshold adjustment circuit establishes a respective threshold value associated with each respective sensor-derived signal, and wherein the threshold adjustment circuit adjusts at least one of the thresholds in response to the power set point signal; and a comparator circuit for receiving the sensor-derived signals and producing for each sensor-derived signal a corresponding comparison result, wherein each comparison result has a value that can be either positive or negative, and wherein the comparator determines the value of each comparison result according to whether the corresponding sensor-derived signal is greater than or less than the threshold value associated with that sensor-derived signal; and an alert circuit for signaling an alert signifying an abnormal change in the electrical load if any of the comparison results is positive.

18. The electrical circuit of claim 17, wherein:

the comparator circuit and the alert circuit are a programmable computer; and the sensor-derived signals are values stored in a memory of the computer.

19. The electrical circuit of claim 17, wherein the threshold adjustment circuit establishes the threshold values by producing a respective voltage proportional to each respective threshold value.

20. The electrical circuit of claim 17, further comprising:

a memory;

wherein the threshold adjustment circuit establishes the threshold values by storing each respective threshold value in the memory.

21. The electrical circuit of claim 17, wherein the alert circuit further comprises:

a circuit for disabling power from being supplied from said power source to said electrical load.

22. An electrical circuit for detecting an abnormal change in an electrical load to which a power source supplies power, comprising:

one or more sensors, wherein each sensor produces a sensor signal responsive to said electrical power or to an electromagnetic condition of the load;

a sensor signal receiving circuit for receiving each sensor signal and for producing one or more sensor-derived signals so that the value of each sensor-derived signals is a function of one or more of the sensor signals; and a comparator circuit for receiving the sensor-derived signals and producing for each sensor-derived signal a corresponding comparison result, wherein each comparison result has a value that can be either positive or negative, and wherein the comparator determines the value of each comparison result according to whether the corresponding sensor-derived signal is greater than or less than a threshold value associated with that sensor-derived signal;

an alert circuit for signaling an alert signifying an abnormal change in the electrical load if any of the comparison results is positive; and a threshold adjustment circuit;

wherein each of said sensor-derived values is characterized by a normal range of values in the absence of an abnormal change in the load; and wherein, in response to the alert circuit signaling said alert, the threshold adjustment circuit changes at least one of the thresholds to a value closer to the normal range of values of the sensor-derived value associated with that threshold.

23. The electrical circuit of claim 22, wherein the alert circuit further comprises:

a circuit for disabling power from being supplied from said power source to said electrical load.

24. The electrical circuit of claim 22, wherein, subsequent to the threshold circuit changing said at least one of the thresholds to a value closer to the normal range of values of the sensor derived value associated with that threshold:

in response to the comparator circuit producing a negative comparison result for each sensor-derived signal, the threshold adjustment circuit restores each of said at least one of the thresholds to their original values.

* * * * *